(12) United States Patent
Moon

(10) Patent No.: US 11,621,311 B2
(45) Date of Patent: Apr. 4, 2023

(54) DISPLAY DEVICE

(71) Applicant: Samsung Display Co., Ltd., Yongin-Si (KR)

(72) Inventor: Dong Il Moon, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 267 days.

(21) Appl. No.: 16/897,213

(22) Filed: Jun. 9, 2020

(65) Prior Publication Data

US 2021/0175314 A1 Jun. 10, 2021

(30) Foreign Application Priority Data

Dec. 6, 2019 (KR) .......................... 10-2019-0161819

(51) Int. Cl.
*H01L 27/32* (2006.01)
*G09G 3/32* (2016.01)
*G09G 3/3208* (2016.01)

(52) U.S. Cl.
CPC .......... *H01L 27/3276* (2013.01); *G09G 3/32* (2013.01); *G09G 3/3208* (2013.01)

(58) Field of Classification Search
CPC ......... G09G 2300/0426; G09G 3/2092; G09G 3/2096; G09G 3/3233; G09G 3/3208; H01L 27/32; H01L 27/3241; H01L 27/3244; H01L 27/3276; H01L 51/0097
See application file for complete search history.

(56) References Cited

U.S. PATENT DOCUMENTS

| 8,952,954 | B2 | 2/2015 | Kwon et al. | |
|---|---|---|---|---|
| 9,293,519 | B2 | 3/2016 | Kwon et al. | |
| 2013/0241808 | A1* | 9/2013 | Kwon | G09G 3/3233 323/284 |
| 2014/0232275 | A1* | 8/2014 | Kwon | G09G 3/3233 315/161 |
| 2014/0362124 | A1* | 12/2014 | Kim | G09G 3/3233 345/77 |
| 2016/0218053 | A1* | 7/2016 | Cho | H01L 24/00 |
| 2016/0300548 | A1* | 10/2016 | Seo | G02F 1/13452 |
| 2017/0263567 | A1* | 9/2017 | Moon | H01L 23/4985 |

FOREIGN PATENT DOCUMENTS

| KR | 10-2019-0014984 A | 2/2019 |
|---|---|---|
| KR | 10-2019-0023859 A | 3/2019 |
| KR | 10-2057286 B1 | 12/2019 |

* cited by examiner

*Primary Examiner* — Koosha Sharifi-Tafreshi
(74) *Attorney, Agent, or Firm* — Innovation Counsel LLP

(57) ABSTRACT

A display device may include a display panel, a first circuit board, a second circuit board, and a power supply. The display panel may include a pixel and a first pad electrically connected to the pixel. The second circuit board may be electrically connected through the first circuit board to the first pad and may include a second pad, a first power connection line, and a first feedback line. The power supply may be electrically connected through the first power connection line to the second pad, may be electrically connected through the first feedback line to the second pad, may supply a first power through the second pad to the display panel, and may receive a feedback voltage of the second pad through the first feedback line.

20 Claims, 8 Drawing Sheets

DISPLAY DEVICE

This application claims priority to Korean Patent Application No. 10-2019-0161819, filed on Dec. 6, 2019 in the Korean Intellectual Property Office; the Korean Patent Application is incorporated by reference.

BACKGROUND

1. Field

The technical field relates to a display device.

2. Description of the Related Art

Modern display devices include liquid crystal display devices and organic light emitting display devices.

An organic light emitting diode display device typically displays an image using organic light emitting diodes that generate light by recombination of electrons and holes. Advantages of an organic light emitting diode display device may include a fast response speed, high luminance, a large viewing angle, and/or low power consumption.

SUMMARY

Embodiments may be related a display device capable of compensating for a voltage drop of a first power.

A display device according to an embodiment includes a display panel including a display area and a plurality of first pads disposed around the display area, a first circuit board having one end attached to the plurality of first pads, a second circuit board attached to another end of the first circuit board, and a power supply configured to supply first power to the display panel. The second circuit board includes a plurality of second pads receiving the first power from the power supply, a first power connection line electrically connecting the plurality of second pads and the power supply to each other, and a first feedback line transferring a feedback voltage of the second pad to the power supply.

The display device may further include a second power connection line connecting the power supply and the first power connection line to each other.

The second circuit board may further include a connector connecting the first power connection line and the second power connection line to each other.

One end of the first power connection line may be connected to the second pad, and another end of the first power connection line may be connected to the connector.

One end of the second power connection line may be connected to the connector, and another end of the second power connection line may be connected to the power supply.

The display device may further include a second feedback line connecting the power supply and the first feedback line to each other.

The second circuit board may further include a connector connecting the first feedback line and the second feedback line to each other.

One end of the first feedback line may be directly connected to the second pad, and another end of the first feedback line may be connected to the connector.

One end of the second feedback line may be connected to the connector, and another end of the second feedback line may be connected to the power supply.

The first power connection line may include a first area extending from the connector, and a plurality of second areas branched from the first area.

One ends of the plurality of second areas may be connected to the plurality of second pads, respectively.

One end of the first feedback line may be directly connected to the second area.

The power supply may adjust an output voltage of the first power in correspondence with the feedback voltage.

The first circuit board may include a plurality of signal lines transferring the first power to the first pad.

One end of the signal line may be connected to the first pad, and another end of the signal line may be connected to the second pad.

An embodiment may be related to a display device. The display device may include a display panel, a first circuit board, a second circuit board, and a power supply. The display panel may include a pixel and a first pad electrically connected to the pixel. The second circuit board may be electrically connected through the first circuit board to the first pad and may include a second pad, a first power connection line, and a first feedback line. The power supply may be electrically connected through the first power connection line to the second pad, may be electrically connected through the first feedback line to the second pad, may supply a first power through the second pad to the display panel, and may receive a feedback voltage of the second pad through the first feedback line.

The display device may include a second power connection line electrically connecting the power supply to the first power connection line.

The second circuit board may include a connector electrically connecting the first power connection line to the second power connection line.

The connector may be electrically connected through the first power connection line to the second pad.

The power supply may be electrically connected through the second power connection line to the connector.

The display device may include a second feedback line electrically connecting the power supply to the first feedback line.

The second circuit board further includes a connector electrically connecting the first feedback line to the second feedback line.

A first end of the first feedback line may be directly connected to the second pad. The first end of the first feedback line may be electrically connected through a second end of the first feedback line to the connector.

The power supply may be electrically connected through the second feedback line to the connector.

The first power connection line may include a first section and a second section. The first section may be electrically connected through the second section to the second pad.

The second section may be directly connected to the second pad.

One end of the first feedback line may be directly connected to the second section.

The power supply may adjust an output voltage of the first power based on the feedback voltage.

The first circuit board may include a signal line electrically connecting the second pad to the first pad for transferring the first power to the first pad.

The signal line may be directly connected to at least one of the first pad and the second pad.

According to embodiments, a display device may sense a voltage drop of a first power by transferring a feedback voltage of a pad disposed on a circuit board to a power supply. Therefore, an output voltage of the first power may be compensated. Advantageously, sufficient luminance of the display device may be maintained.

DETAILED DESCRIPTION

Figure 1:
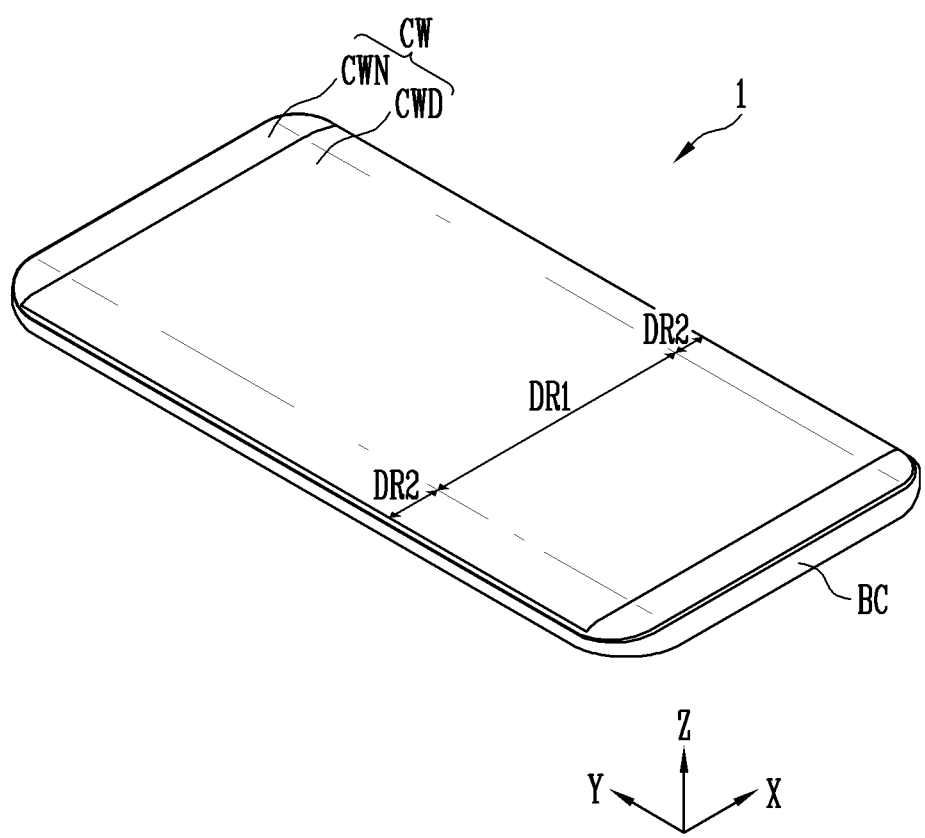
FIG. 1 is a perspective view schematically illustrating a display device according to an embodiment.

Example embodiments are described with reference to the accompanying drawings. Practical embodiments may be implemented in various forms.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

When a first element is referred to as "on" a second element, the first element may be directly or indirectly on the second element.

The same reference numerals may denote identical or analogous components.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control." The term "area" may mean "section."

Features of various embodiments may be combined with in part or in whole.

Figure 2:
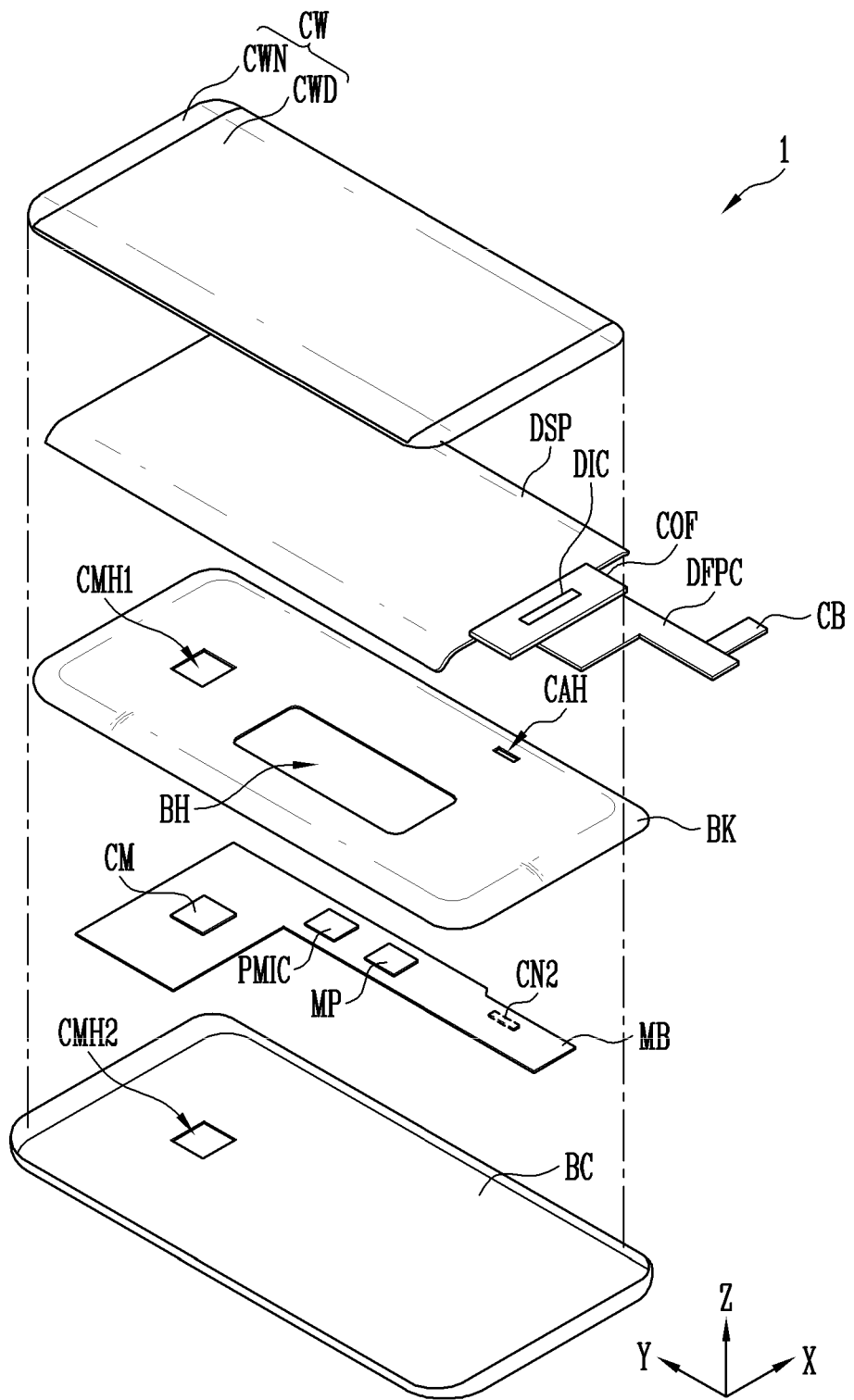
FIG. 2 is an exploded view of the display device according to an embodiment.
Figure 3:
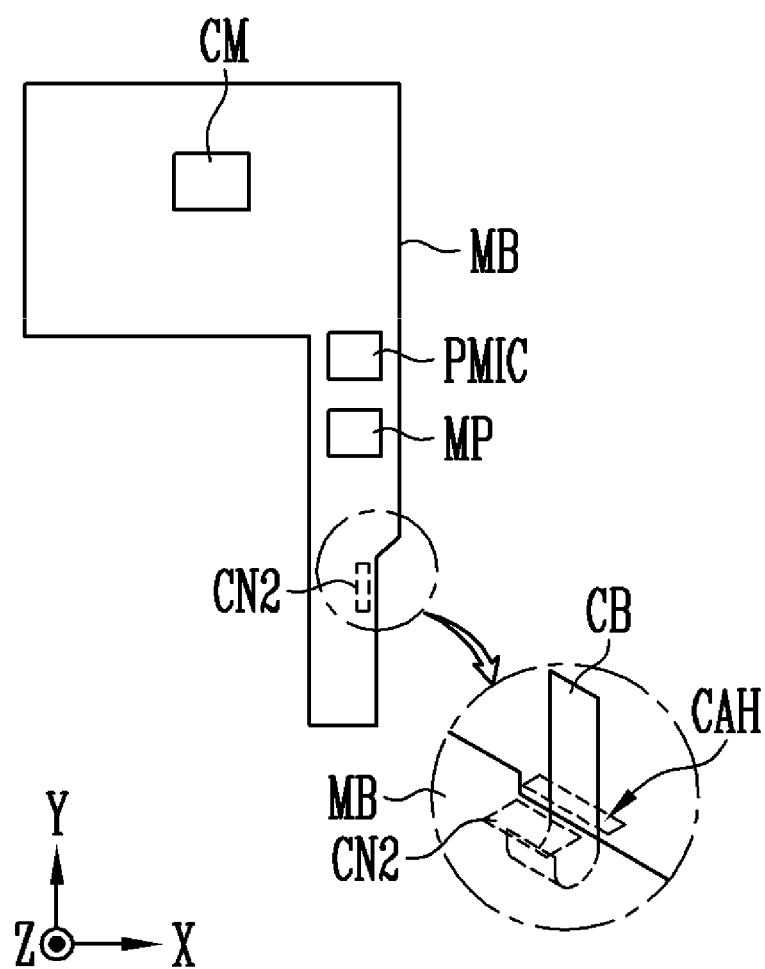
FIG. 3 is a plan view illustrating a main circuit board shown in FIG. 2 according to an embodiment.
Figure 4:
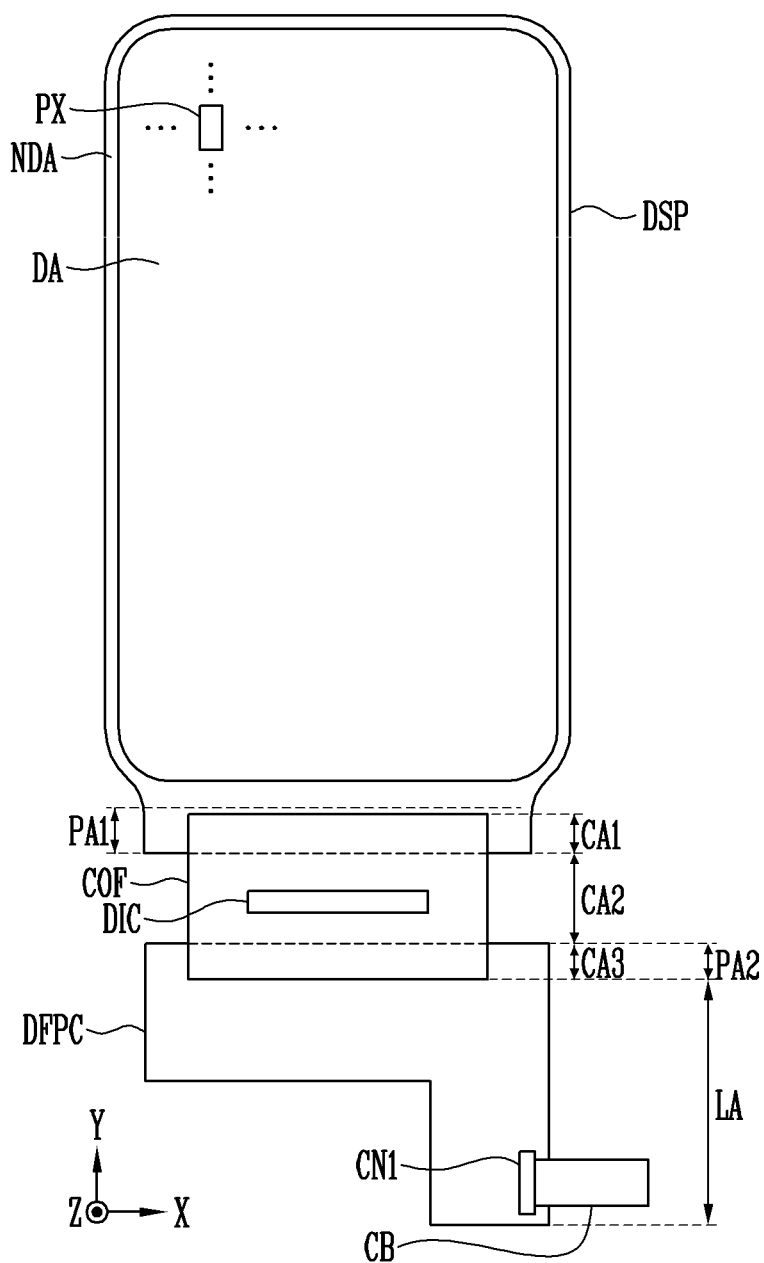
FIG. 4 is a plan view of a display panel according to an embodiment.

FIG. 1 is a perspective view schematically illustrating a display device 1 according to an embodiment. FIG. 2 is an exploded view of the display device according to an embodiment. FIG. 3 is a plan view illustrating a main circuit board shown in FIG. 2 according to an embodiment. FIG. 4 is a plan view of a display panel according to an embodiment.

The display device 1 may be (applied to) one of various electronic devices, a tablet PC, a smartphone, a car navigation unit, a camera, a center information display (CID) in a car, a wrist watch type electronic device, a personal digital assistant (PDA), a portable multimedia player, a game machine, a television, an external billboard, a monitor, a personal computer, and a notebook computer.

In a plan view, display device 1 may have a substantially rectangular shape. For example, the display device 1 may have short sides in a first direction (X-axis direction) and long sides in a second direction (Y-axis direction). A corner where a short side and a long side meet may be rounded with a predetermined curvature or may have a right angle. The display device 1 may have a shape of another polygon, a circle, or an ellipse.

The display device 1 may include a first area DR1 formed flat and two second areas DR2 respectively extending from two opposite sides of the first area DR1. A second area DR2 may be flat or curved. When the second area DR2 is flat, an obtuse angle may be formed by the first area DR1 and the second area DR2. When the second area DR2 is curved, the second area DR2 may have a fixed curvature or multiple curvatures.

The display device 1 may include only one second area DR2 extending from only one side of the first area DR1. The display device 1 may include more than two second areas DR2 extending from more than two sides of the first area DR1.

Referring to FIG. 2, the display device 1 may include a cover window CW, a display panel DSP, a bracket BK, a main circuit board MB, and a lower cover BC.

The cover window CW may be disposed on the display panel DSP so as to cover and protect an upper surface of the display panel DSP.

The cover window CW may be formed of glass, sapphire, and/or plastic. The cover window CW may be rigid or flexible.

The cover window CW may be attached to the upper surface of the display panel DSP through an adhesive member. The adhesive member may be an optically cleared adhesive film (OCA) or an optically cleared resin (OCR).

The cover window CW may include a transmission portion CWD corresponding to the display panel DSP and a light blocking portion CWN extending beyond the display panel DSP.

The cover window CW may be disposed in the first area DR1 and the second area DR2. The transmission portion CWD may be disposed in a portion of the first area DR1 and a portion of the second areas DR2.

The light blocking portion CWN may be opaque. The light blocking portion CWN may include a decoration layer with a pattern. For example, a logo of a company or some letters may be patterned on the light blocking portion CWN. Holes for exposing a front camera, an iris sensor, an illuminance sensor, and the like may be formed in the light blocking portion CWN. Some or all of the front camera, the iris sensor, and the illuminance sensor may be embedded in the display panel DSP without requiring some or all of the holes.

The display panel DSP may be disposed under the cover window CW (in the Z-axis direction). The display panel DSP may overlap the transmission portion CWD of the cover window CW. The display panel DSP may be disposed in the first area DR1 and the second areas DR2. Therefore, the image of the display panel DSP may be displayed not only in the first area DR1 but also in the second areas DR2.

Although not shown in the drawings, a polarization film may be attached between the display panel DSP and the cover window CW to prevent visibility reduction potentially caused by reflection of external light. The polarization film PF may include phase retardation film such as a linear polarization plate and a λ/4 plate (quarter-wave plate). The phase retardation film may be disposed on the display panel DSP, and the linear polarization plate may be disposed between the phase retardation film and the cover window CW.

The display panel DSP may be a light emitting display panel including a light emitting element. For example, the display panel DSP may be an organic light emitting display panel including an organic light emitting diode, a micro light emitting diode display panel including a micro light emitting diode (LED), and a quantum dot light emitting display panel including a quantum dot light emitting diode.

Referring to FIG. 4, the display panel DSP may include a display area DA for displaying an image and a non-display area NDA abutting the display area DA.

The display area DA may include a plurality of pixels PX. The display area DA may be disposed on a front surface or a side surface of the display device 1.

Each of the pixels PX may emit one of a red color, a green color, and a blue color. Each of the pixels PX may emit one of cyan, magenta, yellow, and white.

The pixels PX may be arranged in a matrix having rows and columns in the first direction (X-axis direction) and the second direction (Y-axis direction).

The non-display area NDA may include drivers for driving the pixels PX and may include various wire portions (not shown) connecting the pixels PX and the drivers. The non-display area NDA may abut at least one side of the display area DA. The non-display area NDA may surround the display area DA.

The non-display area NDA may include a first pad area PA1. The first pad area PA1 may be disposed near one short side of the display area DA.

One end of a first circuit board COF may be attached to the first pad area PA1 of the display panel DSP. The first circuit board COF may be bent to a lower/non-display surface of the display panel DSP.

The first circuit board COF may include a first circuit area CA1, a second circuit area CA2, and a third circuit area CA3. The second circuit area CA2 may be disposed between the first circuit area CA1 and the third circuit area CA3.

The first circuit area CA1 may overlap the first pad area PA1 of the display panel DSP. The first circuit area CA1 may be attached to the first pad area PA1 of the display panel DSP through an anisotropic conductive film.

The second circuit area CA2 may accommodate and/or support a driver DIC.

The driver DIC may receive control signals through the first circuit board COF. The driver DIC may include a data driver chip and a gate driver chip. The data driver chip may include data driving circuits that apply a data signal for driving the display panel DSP and a data control signal for controlling the data signal. The gate driver chip may include scan driving circuits that generate a scan high potential voltage, a scan low potential voltage, and a scan control signal. The scan driving circuits may transfer the scan high potential voltage, the scan low potential voltage, and the scan control signal to a gate driver disposed in the non-display area NA.

The driver DIC may be an integrated circuit and may be attached on the first circuit board COF by a chip on glass (COG) method, a chip on plastic (COP) method, or an ultrasonic method.

The third circuit area CA3 may overlap the second circuit board DFPC and may be attached to the second circuit board DFPC.

The second circuit board DFPC may be a rigid printed circuit board or a flexible printed circuit board.

The second circuit board DFPC may include a second pad area PA2 and a wire area LA. The second pad area PA2 may overlap the third circuit area CA3 and may be attached to the third circuit area CA3. The wire area LA may accommodate and/or support a first connector CN1 and wires connected to the first connector CN1.

Referring to FIG. 2, FIG. 3, and FIG. 4, a cable CB may be connected to the first connector CN1. One end of the cable CB may be connected to the first connector CN1, and another end of the cable CB may be connected to a second connector CN2 of a main circuit board MB. Therefore, the second circuit board DFPC may be electrically connected to a power supply PMIC of the main circuit board MB.

Although not shown in the drawings, a panel lower member may be disposed under the display panel DSP. The panel lower member may be attached to the lower/non-display surface of the display panel DSP through an adhesive member. The adhesive member may be a pressure sensitive adhesive (PSA).

The panel lower member may include at least one of a light absorbing member for absorbing light incident from the outside, a buffer member for absorbing impact from the outside, a heat dissipation member for efficiently dissipating heat of the display panel DSP, and a light blocking layer for blocking the light incident from the outside.

The first circuit board COF may be bent, and thus one surface of the second circuit board DFPC may be attached to one surface of the panel lower member. The second circuit board DFPC may be attached to a lower surface of the panel lower member through an adhesive member. The adhesive member may be, for example, a pressure sensitive adhesive.

A bracket BK may be disposed under the display panel DSP (in the Z-axis direction).

The bracket BK may include one or both of plastic and metal.

The bracket BK may include a first camera hole CMH1 (for accommodating a camera device CM), a battery hole BH (for accommodating a battery), and a cable hole CAH (for allowing the cable CB to connect to the second connector CN2).

The main circuit board MB may be disposed under the bracket BK (in the Z-axis direction). The main circuit board MB may be a rigid printed circuit board or a flexible printed circuit board.

The main circuit board MB may include the power supply PMIC, a main processor MP, the camera device CM, and the second connector CN2.

The main processor MP may control overall functions of the display device 1. The main processor MP may output digital video data to the driver DIC through the second circuit board DFPC so that the display panel DSP displays an image.

The main processor MP may be an application processor, a central processing unit, or a system chip as an integrated circuit.

The camera device CM may process an image frame (associated with a still image or a moving image) obtained by an image sensor in the camera mode and may output the processed image frame to the main processor MP.

One end of the cable CB may be connected to the second circuit board DFPC, and another end of the cable CB may be connected to the second connector CN2 through the cable hole CAH of the bracket BK, as shown in FIG. 2 and FIG. 3. Therefore, the main circuit board MB may be electrically connected to the second circuit board DFPC.

The main circuit board MB may be equipped with a mobile communication module capable of transmitting and/ or receiving wireless signals to and/or from at least one of a base station, an external terminal, and a server on a mobile communication network. The wireless signals may be configured for transmission and reception of voice, video, and/or text/multimedia messages.

A lower cover BC may be disposed under the bracket BK and the main circuit board MB (in the Z-axis direction). The lower cover BC may be coupled and fixed to the bracket BK. The lower cover BC may form a lower surface of the display device 1. The lower cover BC may include plastic and/or metal.

The lower cover BC may include a second camera hole CMH2 for accommodating and exposing the camera device CM. A position of the camera device CM and positions of the camera holes CMH1 and CMH2 may be configured according to embodiments.

Figure 5:
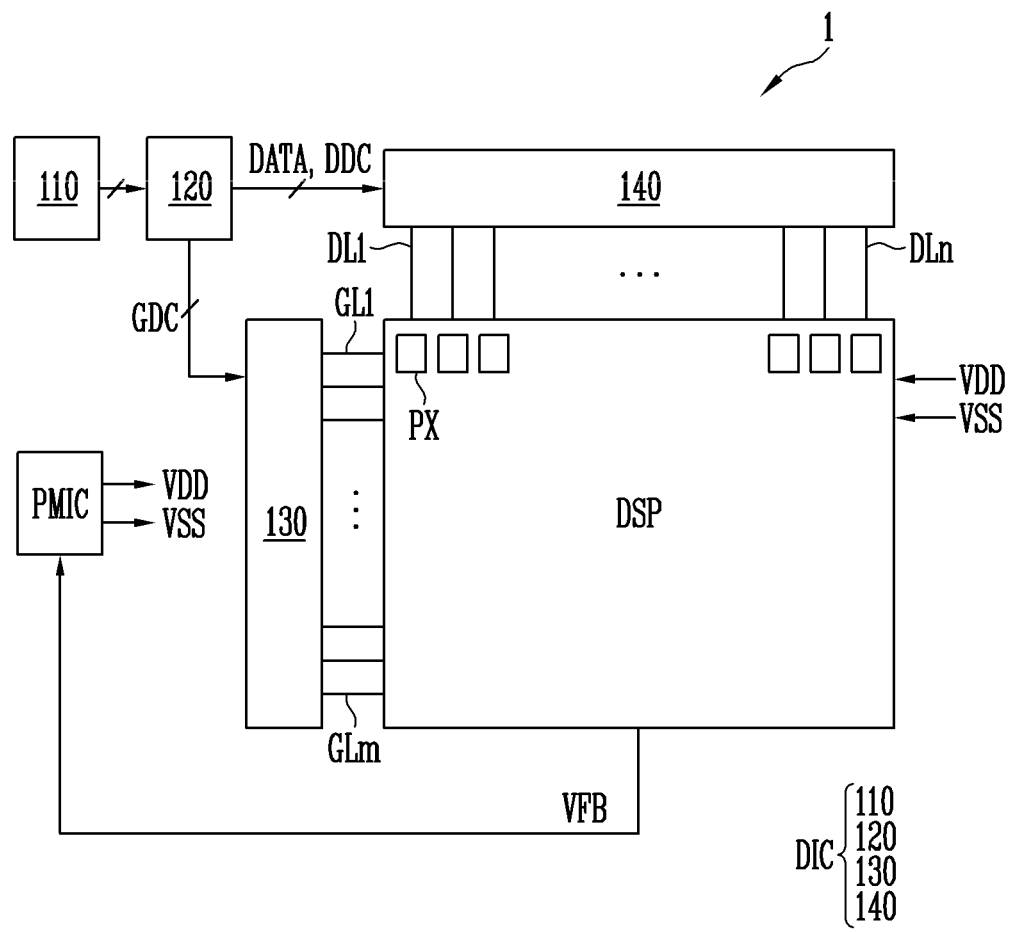
FIG. 5 is a schematic block diagram of the display device according to an embodiment.

FIG. 5 is a schematic block diagram of the display device according to an embodiment.

Referring to FIG. 5, the display device 1 may include an image supplier 110, a timing controller 120, a scan driver 130, a data driver 140, the display panel DSP, and the power supply PMIC.

Pixels PX may be respectively positioned at/near intersections of scan lines GL1 to GLm (m is a positive integer) and data lines DL1 to DLn (n is a positive integer) and may be arranged in a matrix. Each of the pixels PX may be connected to at least one of the scan lines GL1 to GLm and at least one of the data lines DL1 to DLn.

Each of the scan lines GL1 to GLm may extend in a row direction, and each of the data lines DL1 to DLn may extend in a column direction.

A first power VDD and a second power VSS may be provided to each of the pixels PX. The first power VDD and the second power VSS may be voltages necessary for an operation of the pixel PX, and the first power VDD may have a voltage level higher than that of the second power VSS.

Figure 6:
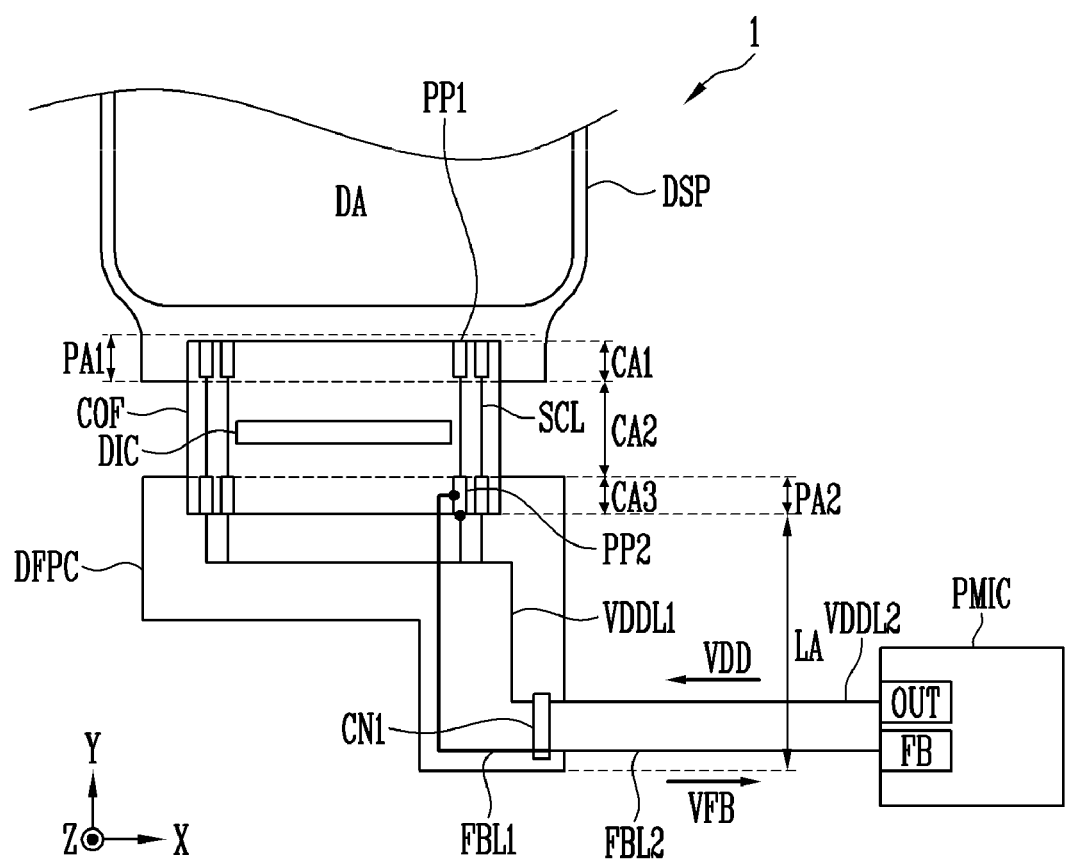
FIG. 6 is a plan view illustrating a power connection line and a feedback line of the display device according to an embodiment.

The pixels PX may be connected to a common first power line, and the first power line may be connected to a first pad PP1 (shown in FIG. 6). The first power VDD may be supplied to the first power line.

The image supplier 110 may process a data signal and may output a processed data signal together with a vertical synchronization signal, a horizontal synchronization signal, a data enable signal, a clock signal, and the like to the timing controller 120.

The timing controller 120 may receive the processed data signal and the like from the image supplier 110 and may output a gate timing control signal GDC (for controlling an operation timing of the scan driver 130) and a data timing control signal DDC (for controlling an operation timing of the data driver 140). The timing controller 120 may supply image data DATA to the data driver 140 together with the data timing control signal DDC.

The scan driver 130 may output a scan signals in response to the gate timing control signal GDC supplied from the timing controller 120. The scan driver 130 may sequentially provide the scan signals to the scan lines GL1 to GLm.

The scan driver 130 may include a shift register (or a stage set) that sequentially generates and outputs pulse-type scan signals corresponding to pulse-type start signals, using a clock signal of the gate timing control signal GDC. The scan signals may be applied to the pixels PX.

The scan driver 130 may be formed in the display panel DSP in a gate in panel manner or as an integrated circuit (IC).

The data driver 140 may generate data signals based on the image data DATA and the data timing control signal DDC provided from the timing controller 120, and may provide the data signals to the pixels PX. The data timing control signal DDC may control an operation of the data driver 140 and may include a load signal (or a data enable signal) for instructing an output of a valid data signal. Each pixel PX may receive a data signal through one of the data lines DL1 to DLn and may emit light at a luminance corresponding to the data signal.

The power supply PMIC may generate the first power VDD and the second power VSS to be supplied to the display panel DSP. The power supply PMIC may generate the powers VDD and VSS based on power input from a power source such as a battery. The power supply PMIC may generate power to be supplied to the scan driver 130, the data driver 140, and the like.

The power supply PMIC may be/include a direct current conversion circuit (e.g., a DC-DC converter) that converts a direct current into a direct current. The power supply PMIC may include an inductor, a diode, a resistor, a boost transistor, and a boost controller that supplies a switching signal to the boost transistor. The power supply PMIC may convert the input power into the first power VDD and output the first power VDD, in correspondence with operations of the inductor, the diode, the boost transistor, and the boost controller.

The power supply PMIC may receive a feedback voltage VFB of the first power VDD and may supply compensated power to the display panel DSP.

FIG. 6 is a plan view illustrating a power connection line and a feedback line of the display device according to an embodiment.

Referring to FIG. 6, a plurality of first pads PP1 may be disposed in the first pad area PA1 of the display panel DSP. The plurality of first pads PP1 may be arranged in the first direction (X-axis direction).

The plurality of first pads PP1 may be attached to the first circuit area CA1 of the first circuit board COF. The plurality of first pads PP1 may receive the first power VDD from the first circuit board COF and the second circuit board DFPC. The first power VDD may be applied through the plurality of first pads PP1 to each of the pixels PX.

A plurality of second pads PP2 may be disposed in the second pad area PA2 of the second circuit board DFPC. The plurality of second pads PP2 may be arranged in the first direction (X-axis direction).

The plurality of second pads PP2 may be attached to the third circuit area CA3 of the first circuit board COF. The plurality of second pads PP2 may receive the first power VDD from the power supply PMIC.

The plurality of first pads PP1 and the second pad PP2 may be electrically connected to each other by a plurality of signal connection lines SCL.

The signal connection lines SCL may extend in the second direction (Y-axis direction) and may be arranged in the first direction (X-axis direction). The plurality of signal connection lines SCL may be disposed in the second circuit area CA2 of the first circuit board COF.

One end of a signal connection line SCL may be disposed in the first circuit area CA1 and connected to a corresponding first pad PP1. Another end of the signal connection line SCL may be disposed in the third circuit area CA3 and connected to a corresponding second pad PP2.

Each first pad PP1 of the display panel DSP and a corresponding second pad PP2 of the second circuit board DFPC may be electrically connected by a corresponding signal connection line SCL of the first circuit board COF.

A first power connection line VDDL1, a first feedback line FBL1, and the first connector CN1 may be disposed in the wire area LA of the second circuit board DFPC.

The first connector CN1 may be electrically connected through the first power connection line VDDL1 to one or more of the second pads PP2. The first power connection line VDDL1 may transfer the first power VDD from the first connector CN1 to the second pad PP2.

One end of a first feedback line FBL1 may be connected to the first connector CN1, and another end of the first feedback line FBL1 may be connected to one or more of the second pads PP2. The first feedback line FBL1 may transfer the feedback voltage VFB of the first power VDD from the second pad(s) PP2 to the first connector CN1.

The first connector CN1 may connect the first power connection line VDDL1 and a second power connection line VDDL2 to each other. One end of the second power connection line VDDL2 may be connected to an output terminal OUT of the power supply PMIC, and another end of the second power connection line VDDL2 may be connected to the first connector CN1. Therefore, the second power connection line VDDL2 may connect the power supply PMIC and the first power connection line VDDL1 to each other. The first power VDD output from the power supply PMIC may be transferred to the second power connection line VDDL2, may be transferred to the first power connection line VDDL1 through the first connector CN1, and may be provided to the display panel DSP.

The first connector CN1 may connect the first feedback line FBL1 and the second feedback line FBL2 to each other. One end of the second feedback line FBL2 may be connected to a feedback terminal FB of the power supply PMIC, and another end of the second feedback line FBL2 may be connected to the first connector CN1. Therefore, the second feedback line FBL2 may connect the power supply PMIC and the first feedback line FBL1 to each other. The feedback voltage VFB sensed by the second pad(s) PP2 may be transferred to the first feedback line FBL1, may be transferred to the second feedback line FBL2 through the first connector CN1, and may be provided to the power supply PMIC.

The power supply PMIC may adjust an output voltage of the first power VDD by compensating for a voltage drop of the first power VDD based on the feedback voltage VFB.

The first power VDD output from the power supply PMIC may be provided to the display panel DSP through the second circuit board DFPC and the first circuit board COF. In this process, the voltage drop of the first power VDD may occur due to a bonding resistance of the first connector CN1 and/or the circuit boards DFPC and COF. When the power supply PMIC is disposed outside the second circuit board DFPC, loss of the first power VDD due to the first connector CN1 may be significant.

In the display device 1 according to an embodiment, the first feedback line FBL1 is directly connected to a second pad PP2 (which receives the first power VDD), and thus the feedback voltage VFB of the second pad PP2 may be provided to the power supply PMIC. Therefore, the power supply PMIC may determine the voltage drop of the first power VDD, may compensate for the reduced first power VDD, and may output the compensated first power VDD. Thus, the same characteristic of the first power VDD may be maintained in the display panel DSP. Even though the voltage drop of the first power VDD occurs in the first connector CN1 due to the external power supply PMIC, the first power VDD of the targeted level may be provided to the plurality of pixels PX of the display panel DSP. Even though the display panel DSP does not include a separate pad for sensing the voltage drop of the first power VDD, the voltage drop of the first power VDD due to the external power supply PMIC may be compensated in real time. Advantageously, satisfactory luminance levels of the display device 1 may be maintained.

Figure 7:
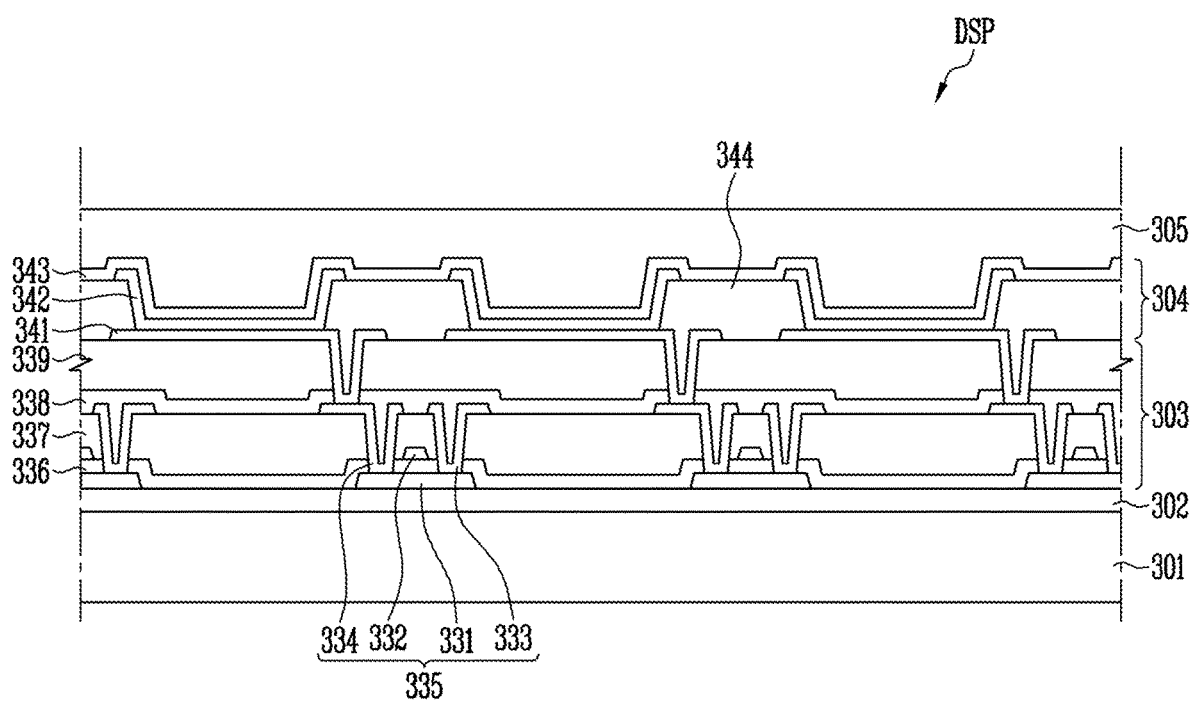
FIG. 7 is a cross-sectional view of the display panel according to an embodiment.

FIG. 7 is a cross-sectional view of the display panel according to an embodiment.

Referring to FIG. 7, the display panel DSP may include a substrate 301, a buffer layer 302, a thin film transistor layer 303, a light emitting element layer 304, and a thin film encapsulation layer 305.

The substrate 301 may be a rigid substrate or a flexible substrate capable of bending, folding, rolling, and the like. The substrate 301 may be formed of an insulating material such as glass, quartz, and/or polymer resin. An example of a polymer material may be polyethersulphone (PES), polyacrylate (PA), polyarylate (PAR), polyetherimide (PEI), polyethylenenaphthalate (PEN), polyethylene terephthalate (PET), polyphenylenesulfide (PPS), polyallylate, polyimide (PI), polycarbonate (PC), cellulose triacetate (CAT), cellulose acetate propionate (CAP), or a combination of some of these materials. The substrate 301 may include a metal material.

The buffer layer 302 may be disposed on the substrate 301 to protect thin film transistors 335 and light emitting elements from moisture. The buffer layer 302 may include a plurality of inorganic films that are alternately stacked. The buffer layer 302 may include one or more silicon oxide (SiOx) films, one or more silicon nitride (SiNx) films, and one or more SiON films that are (alternately) stacked. The buffer layer 302 may be optional.

The thin film transistor layer 303 may be disposed on the buffer layer 302. The thin film transistor layer 303 may include the thin film transistors 335, a gate insulating film 336, an interlayer insulating film 337, a passivation film 338, and the planarization film 339.

Each of the thin film transistors 335 may include an active layer 331, a gate electrode 332, a source electrode 333, and a drain electrode 334. FIG. 7 illustrates that the thin film transistor 335 has an upper-gate (top-gate) structure in which the gate electrode 332 is positioned on the active layer 331. The thin film transistors 335 may have a lower-gate (bottom-gate) structure in which the gate electrode 332 is positioned under the active layer 331 or may have a double-gate structure in which two gate electrodes 332 are disposed on and under the active layer 331.

The active layer 331 may be disposed on the buffer layer 302. The active layer 331 may be formed of a silicon-based semiconductor material or an oxide-based semiconductor material. A light blocking layer (for blocking external light incident to the active layer 331) may be disposed between the buffer layer 302 and the active layer 331.

The gate insulating film 336 may be disposed on the active layer 331. The gate insulating film 336 may be/include an inorganic film, for example, a silicon oxide (SiOx) film and/or a silicon nitride (SiNx) film.

The gate electrode 332 and a gate line may be disposed on the gate insulating film 336. The gate electrode 332 and the gate line may be formed of at least one of molybdenum (Mo), aluminum (Al), chromium (Cr), gold (Au), titanium (Ti), nickel (Ni), neodymium (Nd), and copper (Cu).

The interlayer insulating film 337 may be disposed on the gate electrode 332 and the gate line. The interlayer insulating film 337 may be/include an inorganic film, for example, a silicon oxide (SiOx) film and/or a silicon nitride (SiNx) film.

The source electrode 333, the drain electrode 334, and a data line may be formed on the interlayer insulating film 337. Each of the source electrode 333 and the drain electrode 334 may be connected to the active layer 331 through a contact hole passing through the gate insulating film 336 and the interlayer insulating film 337. The source electrode 333, the drain electrode 334, and the data line may be formed of at least one of molybdenum (Mo), aluminum (Al), chromium (Cr), gold (Au), titanium (Ti), nickel (Ni), neodymium (Nd), and copper (Cu).

The protective film 338 may be disposed on the source electrode 333, the drain electrode 334, and the data line to insulate the thin film transistor 335. The protective film 338 may be/include an inorganic layer, for example, a silicon oxide (SiOx) layer and/or a silicon nitride (SiNx) layer.

The planarization film 339 may be disposed on the protective film 338 to planarize a step difference due to the thin film transistor 335. The planarization film 339 may be formed of at least one of an acryl resin, an epoxy resin, a phenolic resin, a polyamide resin, and a polyimide resin.

The light emitting element layer 304 may be disposed on the thin film transistor layer 303. The light emitting element layer 304 may include light emitting elements and a pixel definition film 344.

The light emitting elements and the pixel definition film 344 may be disposed on the planarization film 339. Each of the light emitting elements may be an organic light emitting element. The light emitting element may include a first electrode 341, light emitting layers 342, and a second electrode 343.

The first electrode 341 may be disposed on the planarization film 339. The first electrode 341 may be connected to the drain electrode 334 of the thin film transistor 335 through a contact hole passing through the protective film 338 and the planarization film 339.

The pixel definition film 344 may cover an edge of the first electrode 341 on the planarization film 339. The pixel definition film 344 may define light emission areas of the pixels. In a pixel, the first electrode 341, the light emitting layer 342, and the second electrode 343 are sequentially stacked; a hole from the first electrode 341 and an electron from the second electrode 343 are combined to each other in the light emitting layer 342 to emit light.

The light emitting layer 342 may be disposed on the first electrode 341 and the pixel definition film 344. The light emitting layer 342 may be an organic light emitting layer. The light emitting layer 342 may emit one of red light, green light, and blue light. The light emitting layer 342 may emit white light. The light emitting layer 342 may include a red light emitting layer, a green light emitting layer, and a blue light emitting layer that are stacked. The light emitting layer 342 may be a common layer commonly formed in the pixels. The display panel DSP may include a separate color filter for displaying red, green, and blue.

The light emitting layer 342 may include a hole transporting layer, a light emitting layer, and an electron transporting layer. The light emitting layer 342 may have a tandem structure of two or more stacks, and a charge generation layer may be formed between the stacks.

The second electrode 343 may be disposed on the light emitting layer 342. The second electrode 343 may cover the light emitting layer 342. The second electrode 343 may be a common layer commonly formed in the pixels.

When the light emitting element layer 304 has a top emission structure for emitting light in an upward direction, the first electrode 341 may be formed of a metal material of high reflectance. The first electrode 341 may include a stack structure of aluminum and titanium (Ti—Al—Ti), a stack structure of aluminum and ITO (ITO-Al-ITO), an APC alloy, and/or a stack structure of an APC alloy and ITO (ITO-APC-ITO). The APC alloy is an alloy of silver (Ag), palladium (Pd), and copper (Cu). The second electrode 343 may be formed of a transparent conductive material (TCM), such as ITO or IZO, or a semi-transmissive conductive material, such as magnesium (Mg), silver (Ag), or an alloy of magnesium (Mg) and silver (Ag). When the second electrode 343 is formed of a semi-transmissive metal material, light emission efficiency may be increased by a micro cavity.

When the light emitting element layer 304 has a bottom emission structure for emitting light in a downward direction, the first electrode 341 may be formed of a transparent conductive material (TCM), such as ITO or IZO, or a semi-transmissive conductive material, such as magnesium (Mg), silver (Ag), or an alloy of magnesium (Mg) and silver (Ag). The second electrode 343 may be formed of a metal material of high reflectance. The second electrode 343 may include a stack structure of aluminum and titanium (Ti—Al—Ti), a stack structure of aluminum and ITO (ITO-Al-ITO), an APC alloy, and/or a stack structure of an APC alloy and ITO (ITO-APC-ITO). When the first electrode 341 is formed of a semi-transmissive metal material, light emission efficiency may be increased by a micro cavity.

The thin film encapsulation layer 305 may be disposed on the light emitting element layer 304. The thin film encapsulation layer 305 may prevent oxygen or moisture from penetrating into the light emitting layer 342 and the second electrode 343. The thin film encapsulation layer 305 may include at least one inorganic film. The inorganic film may be formed of silicon nitride, aluminum nitride, zirconium nitride, titanium nitride, hafnium nitride, tantalum nitride, silicon oxide, aluminum oxide, or titanium oxide.

The thin film encapsulation layer 305 may further include at least one organic film. The organic film may have a sufficient thickness so as to prevent particles from penetrating the thin film encapsulation layer 305 into the light emitting layer 342 and the second electrode 343. The organic film may include epoxy, acrylate, or urethane acrylate.

Although not shown in the drawings, a sensing layer may be disposed on the thin film encapsulation layer 305. Since the sensing layer is directly disposed on the thin film encapsulation layer 305, a thickness of the display device 1 may be minimized without requiring a separate sensing panel. The sensing layer may include touch electrodes for sensing a touch of a user in a capacitive manner, and may include touch lines connecting pads and the touch electrodes to each other.

According to embodiments, the first feedback line FBL1 is directly connected to the second pad PP2 receiving the first power VDD and provides the feedback voltage VFB of the second pad PP2 to the power supply PMIC. Therefore, the power supply PMIC may determine the voltage drop of the first power VDD, may compensate for the reduced first power VDD, and may output the compensated first power VDD. Therefore, the same characteristic of the first power VDD may be maintained in the display panel DSP. Advantageously, satisfactory luminance levels of the display device 1 may be maintained.

Figure 8:
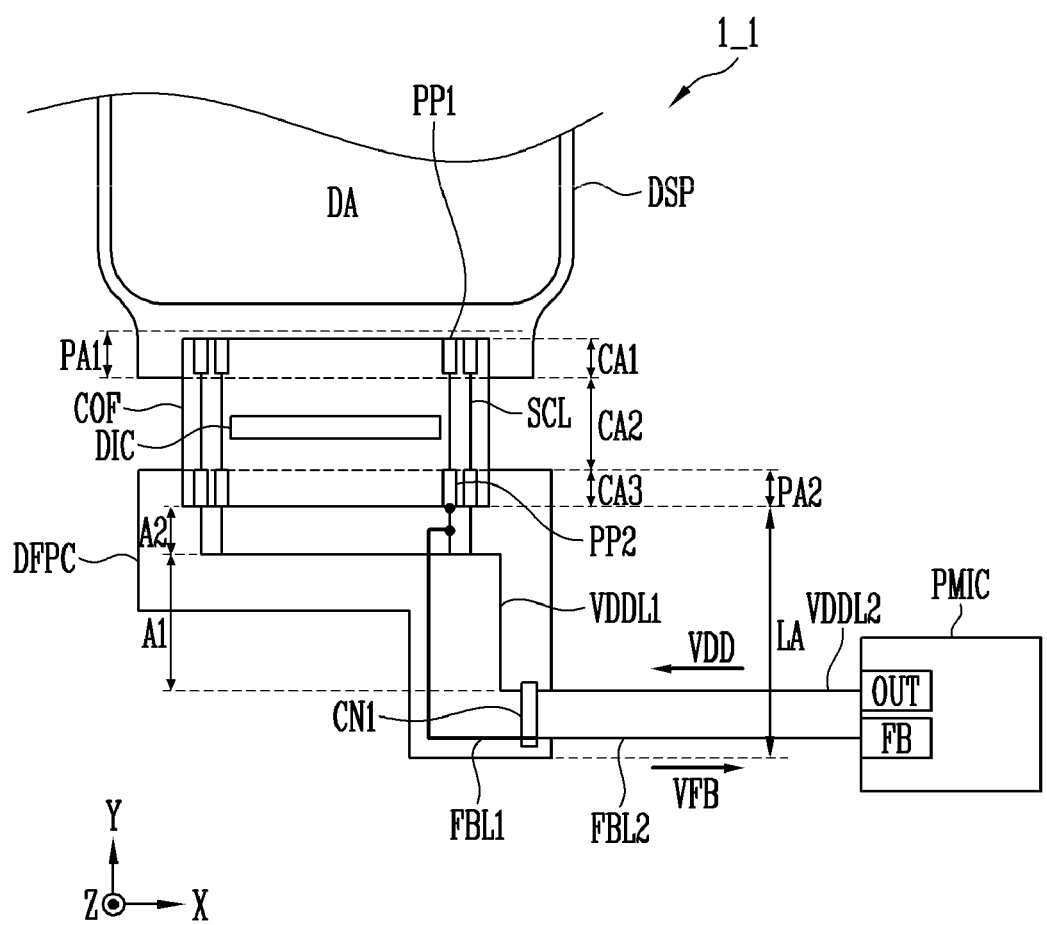
FIG. 8 is a plan view of a display device according to an embodiment.

FIG. 8 is a plan view of a display device according to an embodiment.

Referring to FIG. 8, the display device 1_1 is different from the display device 1 of FIGS. 1 to 7 in that the first feedback line FBL1 is directly connected to the first power connection line VDDL1.

The first power connection line VDDL1 may include a first area/section A1 extending from the first connector CN1 and a plurality of second areas/sections A2 branched from the first area A1.

One end of the first area A1 of the first power connection line VDDL1 may be (directly) connected to the first connector CN1, and another end of the first area A1 may be connected to the second areas A2 at a branch point.

One end of each second area A2 of the first power connection line VDDL1 may be connected to the first area A1 at a branch point, and another end of each second area A2 may be connected to a corresponding second pad PP2.

One end of the first feedback line FBL1 may be (directly) connected to the first connector CN1, and another end of the first feedback line FBL1 may be (directly) connected through a second area A2 of the first power connection line VDDL1 to a second pad PP2. Therefore, the power supply PMIC may sense the feedback voltage VFB at the second pad PP2 through the first feedback line FBL1.

Features of the feedback lines FBL1 and FBL2, the power connection lines VDDL1 and VDDL2, and the power supply PMIC may be identical or analogous to those described with reference to FIGS. 1 to 7.

The third circuit area CA3 may include many wires and may not have a sufficient space restriction for directly connecting the second pad PP2 and the first feedback line FBL1 to each other. Therefore, in the display device 1_1, the first feedback line FBL1 is directly connected to the second area A2 of the first power connection line VDDL1 and indirectly connected to the second pad PP2. Therefore, wire design freedom related to the second circuit board DFPC may be optimized.

According to embodiments, although a voltage drop due to a bonding resistance of the second pad PP2 may not be directly reflected, a voltage loss may still be fed back. Therefore, even though the display panel DSP does not include a separate pad for sensing the voltage drop of the first power VDD, the voltage drop of the first power VDD due to the external power supply PMIC may be compensated in real time. Advantageously, satisfactory luminance levels of the display device 1_1 may be maintained.

The above-described embodiments are illustrative and not restrictive. The scope of the disclosure is defined by the following claims. All changes and modifications to the above-described embodiments are within the scope of the disclosure.

What is claimed is:

1. A display device comprising:
   a display panel comprising a pixel and a first pad electrically connected to the pixel;
   a first circuit board;
   a second circuit board electrically connected through the first circuit board to the first pad and comprising a second pad, a first power connection line, and a first feedback line, wherein the first power connection line is directly connected to a first side of the second pad, wherein the first feedback line is directly connected to a second side of the second pad, and wherein the second side of the second pad is not aligned with the first side of the second pad; and
   a power supply electrically connected through the first power connection line to the second pad, electrically connected through the first feedback line to the second pad, configured to supply a first power through the second pad to the display panel, and configured to receive a feedback voltage of the second pad through the first feedback line.

2. The display device according to claim 1, further comprising:
   a second power connection line electrically connecting the power supply to the first power connection line.

3. The display device according to claim 2, wherein the second circuit board further comprises a connector electrically connecting the first power connection line to the second power connection line.

4. The display device according to claim 3, wherein the connector is electrically connected through the first power connection line to the second pad.

5. The display device according to claim 3, wherein the power supply is electrically connected through the second power connection line to the connector.

6. The display device according to claim 1, further comprising:
   a second feedback line electrically connecting the power supply to the first feedback line.

7. The display device according to claim 6, wherein the second circuit board further comprises a connector electrically connecting the first feedback line to the second feedback line.

8. The display device according to claim 7, wherein a first end of the first feedback line is directly connected to the second pad, and
   wherein the first end of the first feedback line is electrically connected through a second end of the first feedback line to the connector.

9. The display device according to claim 7, wherein the power supply is electrically connected through the second feedback line to the connector.

10. The display device according to claim 7, wherein the first power connection line includes a first section and a second section, and wherein the first section is electrically connected through the second section to the second pad.

11. The display device according to claim 10, wherein the second section is directly connected to the second pad.

12. The display device according to claim 10, wherein one end of the first feedback line is directly connected to the second section.

13. The display device according to claim 1, wherein the power supply adjusts an output voltage of the first power based on the feedback voltage.

14. The display device according to claim 1, wherein the first circuit board includes a signal line electrically connecting the second pad to the first pad for transferring the first power to the first pad.

15. The display device according to claim 14, wherein the signal line is directly connected to at least one of the first pad and the second pad.

16. A display device comprising:
   a display panel comprising a pixel and a first pad electrically connected to the pixel;
   a first circuit board;
   a second circuit board electrically connected through the first circuit board to the first pad and comprising a second pad, a first power connection line, and a first feedback line; and
   a power supply electrically connected through the first power connection line to the second pad, electrically connected through the first feedback line to the second pad, configured to supply a first power through the second pad to the display panel, and configured to receive a feedback voltage of the second pad through the first feedback line, wherein the first feedback line is directly connected to the first power connection line.

17. The display device according to claim 1, wherein the second side of the second pad is perpendicular to the first side of the second pad.

18. The display device according to claim 1, wherein the second side of the second pad is longer than the first side of the second pad.

19. The display device according to claim 1, wherein the second side of the second pad is directly connected to the first side of the second pad.

20. The display device according to claim 1, wherein the first feedback line crosses the first power connection line.

* * * * *